(12) United States Patent
Utsumi et al.

(10) Patent No.: US 6,580,108 B1
(45) Date of Patent: Jun. 17, 2003

(54) INSULATED GATE BIPOLAR TRANSISTOR DECREASING THE GATE RESISTANCE

(75) Inventors: Tomoyuki Utsumi, Hitachi (JP); Shoichi Ozeki, Hitachi (JP); Koichi Suda, Mito (JP)

(73) Assignees: Hitachi, Ltd., Tokyo (JP); Hitachi Haramachi Electronics Co., Ltd., Ibaraki (JP)

( * ) Notice: Subject to any disclaimer, the term of this patent is extended or adjusted under 35 U.S.C. 154(b) by 0 days.

(21) Appl. No.: 09/497,213

(22) Filed: Feb. 3, 2000

(30) Foreign Application Priority Data

Feb. 4, 1999 (JP) .............................. 11-026967

(51) Int. Cl.[7] ................ H01L 29/76; H01L 29/94; H01L 31/062
(52) U.S. Cl. ................... 257/288; 257/364; 257/368; 257/372; 257/378; 257/557; 257/587
(58) Field of Search ..................... 257/288, 364, 257/368, 372, 378, 557, 587

(56) References Cited

U.S. PATENT DOCUMENTS 5,343,052 A * 8/1994 Oohata et al. ............... 257/141
5,729,032 A * 3/1998 Tomomatsu et al. ......... 257/139
5,731,605 A * 3/1998 Schlangenotto et al. ..... 257/164
5,893,736 A * 4/1999 Lee et al. .................... 438/271
6,194,763 B1 * 2/2001 Hisamoto et al. ........... 257/353

FOREIGN PATENT DOCUMENTS

| JP | 61-44854 | 3/1986 |
| JP | 5-29614 | 2/1993 |
| JP | 05-029614 | 5/1993 |
| JP | 10173176 | 6/1998 |

* cited by examiner

*Primary Examiner*—Eddie Lee
*Assistant Examiner*—Matthew E. Warren
(74) *Attorney, Agent, or Firm*—Antonelli, Terry, Stout & Kraus, LLP

(57) ABSTRACT

An insulated gate transistor comprising a first semiconductor region, a second semiconductor region includes plural portions, a third semiconductor region, a fourth semiconductor region, a first insulation layer, control electrodes, a first main electrode, and a second main electrode, wherein a metallic wiring layer is provided on the first main surface plane via an insulating layer, plural regions insulated from the first main electrode are provided through said first main electrode, and the metallic wiring layer is connected electrically to the control electrode through the insulating layer via the region insulated from the main electrode.

13 Claims, 3 Drawing Sheets

INSULATED GATE BIPOLAR TRANSISTOR DECREASING THE GATE RESISTANCE

BACKGROUND OF THE INVENTION

The present invention relates to an insulated gate transistor, and more particularly, to an insulated gate transistor which is superior in preventing the latch-up phenomenon or current concentration of the transistor.

Currently, and insulated gate bipolar transistor (hereinafter abbreviated as IGBT) having a fast operation and a low on-resistance is used as a power switching device. The IGBT has a structure, wherein: a p-type base region extending from a main surface to its inner portion and a n-type emitter region extending from the base region to its inner portion are formed on one side of a main surface of a n-type semiconductor substrate, which operates as a drift region; a p-type collector region is formed on another side of the main surface of the semiconductor substrate separate from the base region; emitter electrodes are provided on the emitter region and the base region; and a collector electrode is provided on the collector region. The IGBT has the following feature. When a voltage, which makes the collector electrode have a positive potential relative to the emitter electrode, is applied to the collector electrode, and a positive voltage is applied to the gate electrode, electrons in the emitter region reach the collector region through channels and a drift region. The electrons, which reach the collector region, enhance injection of positive holes from the collector region. Accordingly, the drift region having a high resistance is conductivity-modulated to be a low resistance region, and an on-resistance lower than a MOSFET, the collector region of which is changed to a n-type drain region having no function to inject positive holes, is realized with approximately the same structure as a MOSFET.

When an IC is realized by combining the IGBT with other circuit elements, a lateral structure, wherein the emitter electrode, the collector electrode, and the gate electrode are provided on a same surface of the semiconductor substrate, is desirable in order to facilitate connection among the electrodes. An example of this structure is disclosed, for instance, in JP-A-5-29614 (1993).

On the other hand, in the IGBT, the conventional current which can be passed through a unit composed of a pair of collector-emitter electrodes is restricted. Therefore, a desired current capacity is realized by integrating a large number of unit IGBTS in the semiconductor substrate.

The IGBT disclosed in JP-A-5-29614 (1993) has a structure wherein the emitter region, the base region, and the collector region have a comb shape, respectively, and respective teeth portions of the emitter region and the base region are engaged with the collector region. Gate electrodes are provided on the base region, a drift region in the vicinity of the base region, and the emitter region via an insulating film. The emitter electrode and the collector electrode are provided on each of the emitter region and the base region, respectively. Both the emitter electrode and the collector electrode have a comb shape, and teeth portions of the emitter electrode and the collector electrode are engaged with each other.

Conventionally, polycrystalline silicon is used as the material of the gate electrode. However, in lateral IGBT having a conventional structure, a non-uniformity of the gate resistance is created due to the longitudinal resistance of the gate electrode, and the turn-off action is delayed at the portion having a large gate resistance in a turn-off operation.

Most of the load of the inverter device generally comprises an inductive loads. Therefore, at that time, a current concentration is generated at the portion where the turn-off action is delayed, in addition to the effect of maintaining the flow of the large current due to an inductance. As a result, a latch-up phenomenon is caused at that portion. Accordingly, there has been a problem in that the current which is controllable by the IGBT is restricted to a lower level than a designed value.

In order to decrease the delay of the operation time in the element, technology to decrease the resistance of the gate electrode has been disclosed in JP-A-10-173176 (1998) and other publications. However, the technology relates to the structure of a vertical IGBT, and any idea to integrate an IGBT and a driving circuit for composing an integrated circuit has not been considered.

SUMMARY OF THE INVENTION

One of the objects of the present invention is to provide an insulated gate transistor having an improved latch-up preventing performance by decreasing the resistance of the gate electrode.

The feature of the insulated gate transistor for achieving the above object by the present invention is in providing a metallic wiring layer on the emitter electrode via an insulating layer; providing plural regions insulated from a first main electrode in the first main electrode; and connecting the metallic wiring layer electrically with the gate electrode through the plural regions insulated from the first main electrode.

DETAILED DESCRIPTION OF THE PREFERRED EMBODIMENTS

Hereinafter, details of an embodiment of the present invention will be explained with reference to FIG. 1, FIG. 2 and FIG. 3.

Figure 1:
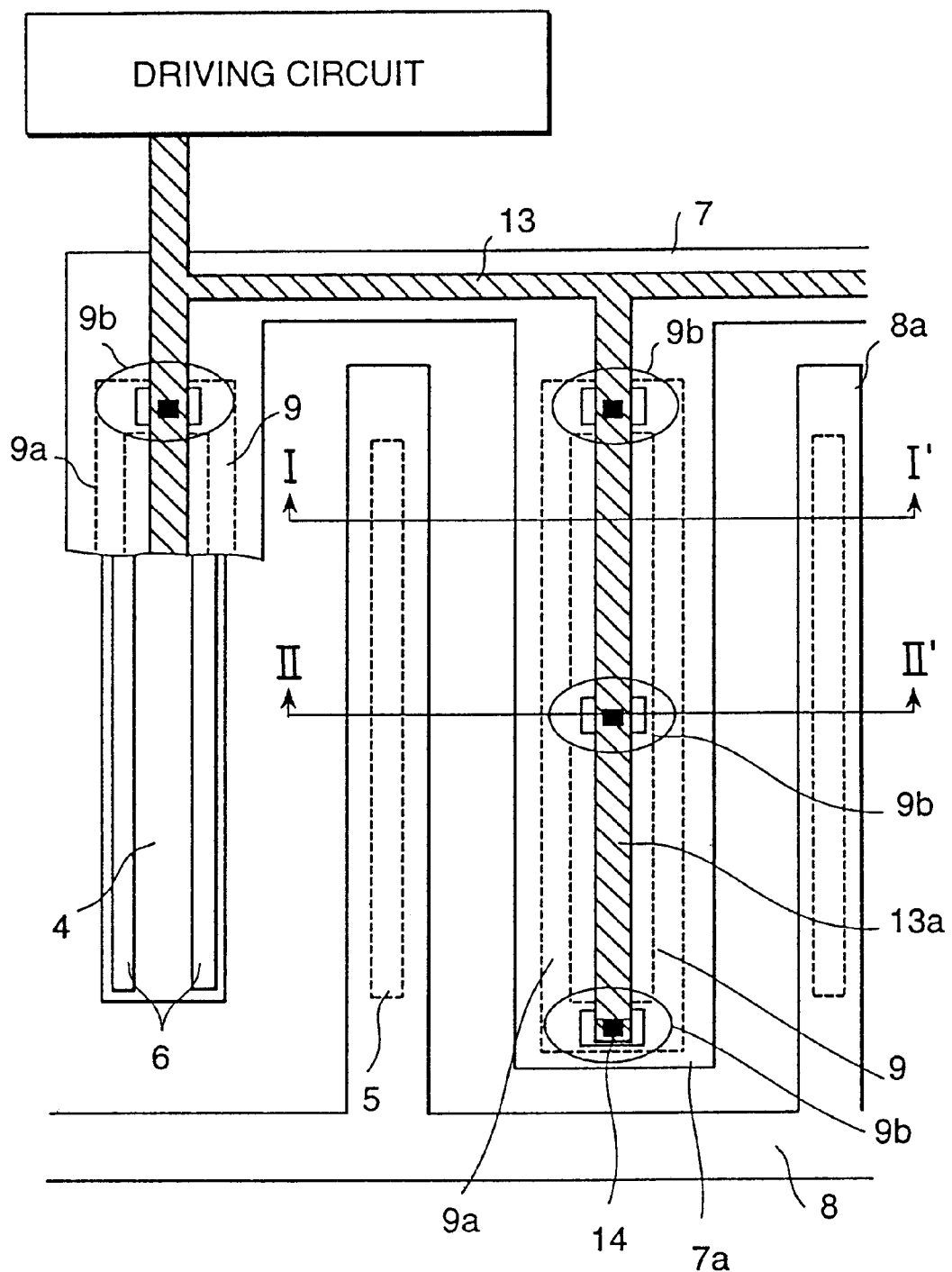
FIG. 1 is a schematic partial plan view of a lateral insulated gate bipolar transistor representing an embodiment of the present invention.
Figure 2:
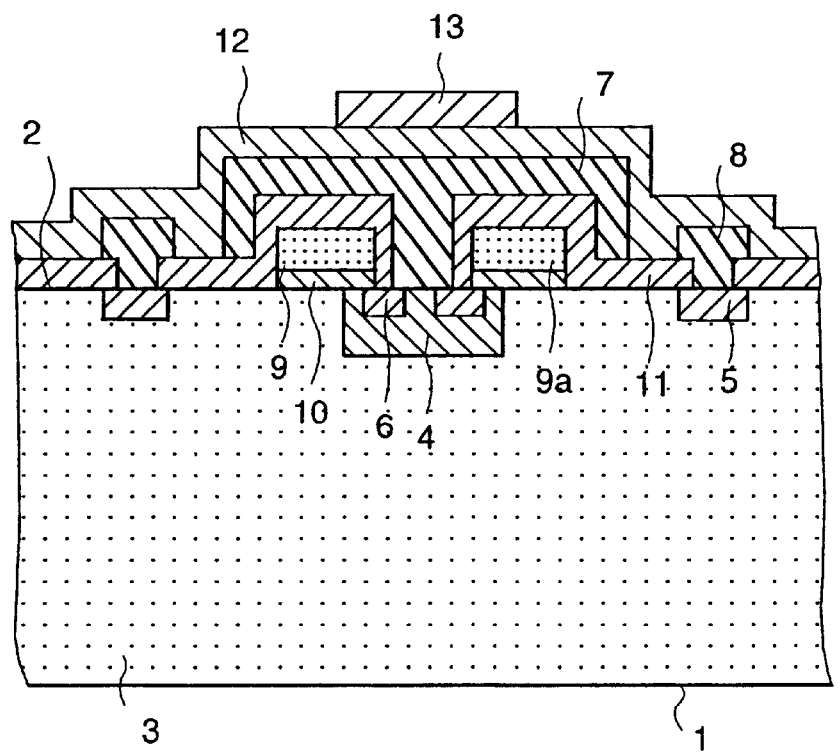
FIG. 2 is a cross sectional view taken along the line A–A' of FIG. 1.
Figure 3:
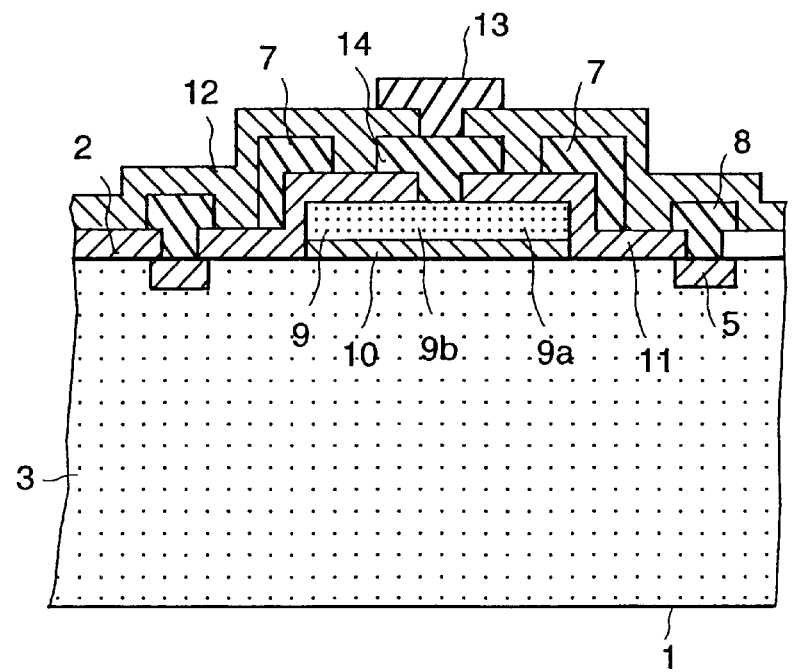
FIG. 3 is a cross sectional view taken along the line B–B' of FIG. 1.

FIG. 1 is a schematic partial plan view of a lateral insulated gate bipolar transistor representing an embodiment of the present invention, and FIG. 2 is a cross sectional view taken along the line A–A' of FIG. 1. In accordance with FIG. 2, a semiconductor substrate 1 comprises a n conductivity type drift region 3 (first semiconductor region) having a main surface plane 2; a p conductivity type base region 4 (second semiconductor region) and a p conductivity type collector region 5 (third semiconductor region), each of which extends from the main surface plane 2 into the drift region 3, and are provided separately from each other, containing a higher impurity concentration than the drift region 3; and a n conductivity type emitter region 6 (fourth semiconductor region), which extends from the main surface plane 2 into the base region 4, containing a higher impurity concentration than the base region 4. Each of the base region 4 and the collector region 5 has a stripe structure, and these regions are aligned in a longitudinal direction and are disposed alternately in a direction perpendicular to the longitudinal direction, as indicated in FIG. 1. The emitter region 6 has a stripe shape, and two emitter regions are arranged in the base region 4 in a longitudinal direction extending along the longitudinal direction of the base region 4. The emitter electrode 7 (first main electrode), shown as a solid line in FIG. 1, has a comb shape with each of the teeth portion 7a extending along the base region 4 on the main surface plane 2, and being connected electrically to the emitter region 6 and the base region 4. The collector electrode 8 (second main electrode) has a comb shape (expressed by a solid line in FIG. 1 ), with each of the teeth portion 8a extending along the collector region 5 on the main surface plane 2, and being connected electrically to the collector region 5. The polycrystalline silicone gate electrode 9, 9a (control electrode) having a stripe structure is arranged above the base region 4, and the drift region 3 and the emitter region 6, each of which is disposed at adjacent sides of the base region 4, respectively, on the main surface plane 2 via the gate insulating film 10 and extends in a longitudinal direction along the longitudinal direction of the base region 4. The gate electrode 9 is connected electrically to the adjacent gate electrode 9a at three portions, i.e. at both ends and at the middle of its longitudinal direction, using polycrystalline silicone. A first insulating film provided on a part of the base region, the gate electrode, and the drift region, as indicated in FIG. 2. Each of the teeth portions 7a of the emitter electrode 7 and the teeth portions 8a of the collector electrode 8 extend on the first insulating film 11 so as to reach the drift region 3. A second insulating film 12 is formed above the collector electrode 8, the emitter electrode 7, and the first insulating film 11. The gate line 13 having a comb shape is formed on the second insulating film 12 along the emitter electrode 7 with, for instance, aluminum-silicone. The gate line 13 is connected electrically to the polycrystalline silicone at the connecting portions 9b of the gate electrode 9, 9a provided at three portions (both ends and a middle portion of the gate electrode in the longitudinal direction). FIG. 3 indicate a cross sectional view taken along the line B–B' in FIG. 1, showing details of the contacting of the teeth portion 13a of the gate line 13 with the connecting portion 9b of the gate electrode 9, 9a. The connecting portion 9b of the gate electrode 9, 9a is brought in contact with the gate line 13, by cutting off a part of the emitter electrode 7, the first insulating film 11, and the second insulating film 12, via an aluminum-silicone layer 14.

In accordance with the structure of the present invention, the resistance of the gate electrode in the longitudinal direction can be decreased by providing plural connecting portions 9b of the gate electrode 9, 9a in contact with the gate line 13 along the longitudinal direction of the gate electrode 9, in order to pass the gate current at turn-off to the aluminum-silicone line via the nearest connecting point. When plural unit IGBTS are connected in parallel, the gate electrodes of the adjacent unit IGBTS can be readily connected by the gate line 13, and the gate resistance of the whole IGBT can be uniform. As a result, the operating time at the time of turn off in the unit IGBT and the operating time of the whole IGBT can be uniform. Therefore, current concentration can be prevented, and consequently, the latch-up preventing performance can be improved.

In accordance with the present embodiment, the decrease of the gate resistance can be achieved on the main surface plane of the transistor. Therefore, an IC can be readily formed, because the IGBT and a driving circuit for driving it can be connected to each of the dielectric substrate SOI substrate, or respective elements separated by a PN-junction on the same surface plane.

Figure 4:
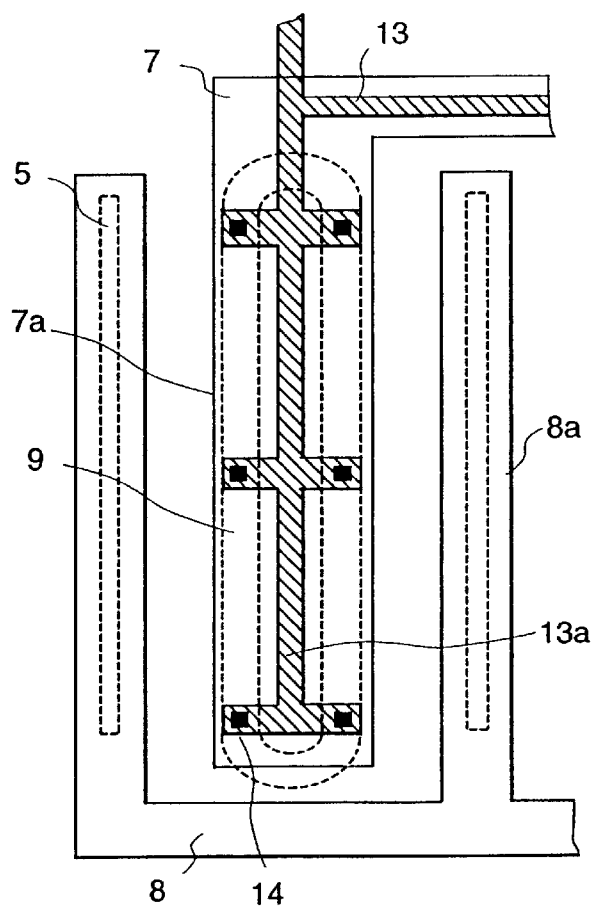
FIG. 4 is a schematic partial plan view of a lateral insulated gate bipolar transistor representing another embodiment of the present invention.

FIG. 4 is a schematic plan view of the lateral insulated gate bipolar transistor according to another embodiment of the present invention. In accordance with FIG. 4, the connection points with the gate line are provided at three points, i.e. both ends and the middle point, of respective gate electrodes 9 and 9a, for decreasing the resistance in the longitudinal direction of the gate electrodes 9 and 9a. The important point for decreasing the gate resistance in the longitudinal direction is to provide plural connecting points on the polycrystalline silicone gate electrode in the longitudinal direction, and to electrically connect each of the connecting points with a low resistance line such as an aluminum-silicone line.

Figure 5:
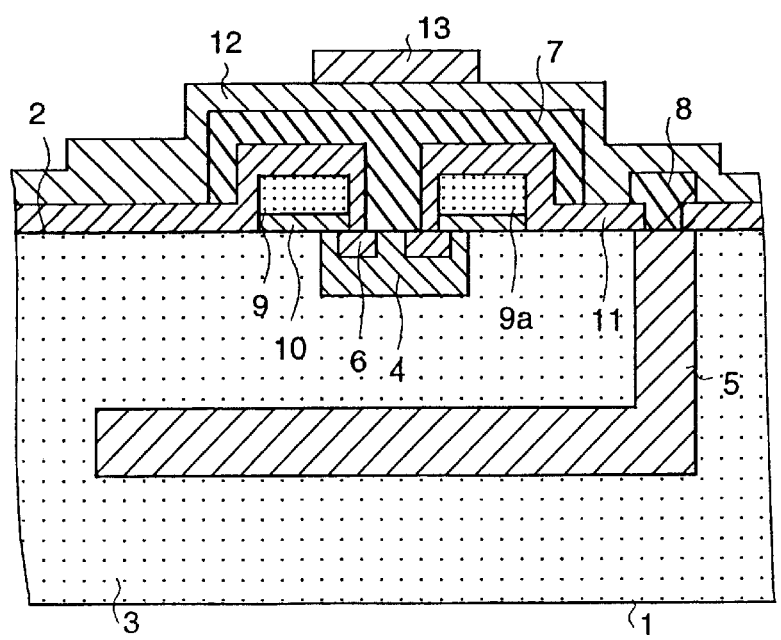
FIG. 5 is a schematic cross sectional view of a vertical insulated gate bipolar transistor according to another embodiment of the present invention.

FIG. 5 is a schematic plan view of a vertical insulated gate bipolar transistor of the present invention. The collector region 5 extends to a portion of the drift region 3 directly under the base and emitter region 4, 6 from the main surface 2. The operation of the respective regions and electrodes are the same as the operation of the lateral insulated gate bipolar transistor indicated in FIG. 2. The same advantages as the lateral insulated gate bipolar transistor can be obtained with the vertical insulated gate bipolar transistor.

In accordance with the present invention, not only the gate resistance of the lateral insulated gate bipolar transistor, but also the gate resistance of the vertical insulated gate bipolar transistor can be decreased. Accordingly, the operating time at the turn-off operation can be made uniform in the element, and latch-up preventing performance can be improved.

The present invention can be applied to both lateral and vertical insulated gate transistors, such as a MOSFET (Metal Oxide Semiconductor Field Effect Transistor). In the insulated gate transistor, the collector regions 5 in FIG. 2 and FIG. 5 are of n conductivity type, which is opposite to the conductivity type of the insulated gate bipolar transistors. In accordance with the present invention, the gate resistance is decreased, and the turn-off operation is made uniform in the element, Therefore, the current concentration or current crowding is prevented. Additionally, the present invention is also applicable to an insulated gate transistor in which the p and n conductivity types of the foregoing embodiments is changed to n and p conductivity types, namely to opposite conductivity types, respectively. In this case, the gate resistance is also reduced.

What is claimed is:

1. An insulated gate transistor comprising:
    a first semiconductor region of a first conductivity type having a main surface plane;
    a second semiconductor region of a second conductivity type comprising plural portions extending from said main surface plane into said first semiconductor region, each of which plural portions comprises a stripe shape, and said plural portions are aligned in a longitudinal direction, and are provided in parallel;
    a third semiconductor region of the second conductivity type comprising plural portions extending from said main surface plane into said first semiconductor region;
    a fourth semiconductor region of the first conductivity type formed along the longitudinal direction of said second semiconductor region, extending from said main surface plane to each of said plural portions in said second semiconductor region;

a first insulation layer formed on said main surface plane crossing over said first, second, and fourth semiconductor regions;

control electrodes, which are composed of polycrystalline semiconductor, crossing over said first, second, and fourth semiconductor regions via said first insulation layer;

a first main electrode connected electrically to said second and fourth semiconductor regions;

a second main electrode connected electrically to said third semiconductor region on said main surface; and a second insulation layer formed on said main surface plane crossing over said first insulation layer, a first main electrode, and a second main electrode;

wherein a metallic wiring layer is provided on said second insulation layer above said main surface plane, disposed above said first main electrode, and connected electrically to said control electrodes through said second insulation layer and said first insulation layer at both ends and a middle portion of said control electrodes in the longitudinal direction.

2. An insulated gate transistor as claimed in claim 1, wherein said plural portions of said second semiconductor region are distributed in the longitudinal direction underneath the first main electrode.

3. An insulated gate transistor as claimed in claim 1, wherein said insulated gate transistor is a lateral insulated gate bipolar transistor.

4. An insulated gate transistor as claimed in claim 1, wherein said metallic wiring layer is connected to said control electrodes via contact holes of the first and second insulation layers provided at said both ends and said middle portion of said control electrodes in the longitudinal direction.

5. An insulated gate transistor comprising:

a first semiconductor region of a first conductivity type having a main surface;

second and third semiconductor regions each of a second conductivity type, each extending into said first semiconductor region from said main surface, said second and third semiconductor regions being elongate in a predetermined direction and being spaced apart transverse to said predetermined direction;

a fourth semiconductor region of said first conductivity type extending into said second semiconductor region from said main surface;

a first insulation layer formed on said main surface extending over said first, second, third and fourth semiconductor regions;

control electrodes disposed in said first insulation layer extending over said first, second, and fourth semiconductor regions;

a first main electrode electrically connected to said second and fourth semiconductor regions, said first main electrode being elongate in said predetermined direction;

a second main electrode electrically connected to said third semiconductor region, said second main electrode being elongated in said predetermined direction; and a second insulation layer formed on said main surface extending over said first main electrode, said second main electrode and said first insulation layer;

wherein a metallic gate line is provided on said second insulation layer above said main surface, disposed above said first main electrode, and electrically connected to said control electrodes through said second insulation layer and said first insulation layer at both ends and a middle portion of said control electrodes in said predetermined direction.

6. An insulated gate transistor as claimed in claim 5, wherein said first conductivity type is a n-type conductivity, and said second conductivity type is a p-type conductivity.

7. An insulated gate transistor as claimed in claim 5, wherein said first semiconductor region is a n-type drift region of a substrate, said second semiconductor region is a p-type base region, said third semiconductor region is a p-type collector region, and said fourth semiconductor region is a n-type emitter region.

8. An insulated gate transistor as claimed in claim 7, wherein said first main electrode extends at least partially over said control electrodes, and is separated therefrom by said first insulation layer.

9. An insulated gate transistor according to claim 5, wherein said metal gate line is an aluminum-silicon layer electrically connected to said both ends and said middle portion of said control electrodes to reduce a resistance in said predetermined direction of said control electrodes.

10. A semiconductor device, comprising:

an array of insulated gate transistors; and a driving circuit for driving an operation of at least an insulated gate transistor arranged in said array of insulated gate transistors; and wherein said insulated gate transistor comprises:

a substrate of a first conductivity type having a main surface;

base and collector regions each of a second conductivity type, each-extending into said substrate from said main surface, said base and collector regions being elongated in a predetermined direction and being spaced apart transverse to said predetermined direction;

an emitter region of said first conductivity type, extending into said base region from said main surface;

a first insulation layer formed on said main surface extending over said base, collector and emitter regions;

a gate electrode dispose in said first insulation layer extending partially over said base and emitter regions;

an emitter electrode arranged in said predetermined direction, and electrically connected to said base region and said emitter region;

a collector electrode arranged in said predetermined direction, and electrically connected to said collector region; and a second insulation layer formed on said main surface extending over said emitter electrode, said collector electrode and said first insulation layer;

wherein a metallic gate line is provided on said second insulation layer above said main surface, disposed above said emitter electrode, and electrically connected to said gate electrodes through said second insulation layer and said first insulation layer at both ends and a middle portion of said gate electrodes in said predetermined direction.

11. A semiconductor device as claimed in claim 10, wherein said first conductivity type is a n-type conductivity, and said second conductivity type is a p-type conductivity.

12. A semiconductor device as claimed in claim 10, wherein said emitter electrode extends at least partially over said gate electrode, and is separated therefrom by said first insulation layer.

13. A semiconductor device as claimed in claim 10, wherein said metal gate line is an aluminum-silicon layer electrically connected to said both ends and said middle portion of said gate electrodes to reduce a resistance in said predetermined direction.

* * * * *